United States Patent [19]

Lipschutz

[11] Patent Number: 4,805,831
[45] Date of Patent: Feb. 21, 1989

[54] BONDING METHOD

[75] Inventor: Lewis D. Lipschutz, Poughkeepsie, N.Y.

[73] Assignee: International Business Machines Corporation, Armonk, N.Y.

[21] Appl. No.: 164,680

[22] Filed: Mar. 7, 1988

Related U.S. Application Data

[63] Continuation of Ser. No. 856,516, Apr. 28, 1986, Pat. No. 4,747,533.

[51] Int. Cl.$^4$ .............................................. B23K 31/02
[52] U.S. Cl. .................................................. 228/180.2
[58] Field of Search .................. 228/34, 35, 37, 180.1, 228/180.2, 200

[56] References Cited

U.S. PATENT DOCUMENTS

| | | |
|---|---|---|
| 4,032,033 | 6/1977 | Chu et al. ............................. 228/200 |
| 4,274,576 | 6/1981 | Shariff ................................... 228/264 |
| 4,332,342 | 6/1982 | Van Derput ......................... 228/200 |
| 4,401,253 | 8/1983 | O'Rourke ............................... 228/37 |
| 4,402,448 | 9/1983 | O'Rourke ............................... 228/37 |
| 4,580,216 | 4/1986 | Barresi et al. ..................... 228/180.1 |
| 4,600,137 | 7/1986 | Comerford ......................... 228/180.1 |
| 4,676,069 | 6/1987 | Miyake ................................. 228/200 |

Primary Examiner—M. Jordan
Attorney, Agent, or Firm—Ira David Blecker

[57] ABSTRACT

A method of reflowing solder terminals that join an electronic device to a substrate. The method includes the steps of contacting the bottom surface of the substrate with a liquid and then controlling the temperature of the liquid when in contact with the substrate so that the temperature of the liquid in contact with the substrate is varied. The latter step involves rapidly increasing the temperature of the liquid from a temperature below the melting point of the solder to a temperature exceeding the melting point of the solder and then rapidly decreasing the temperature of the liquid to a temperature below the melting point of the solder.

13 Claims, 4 Drawing Sheets

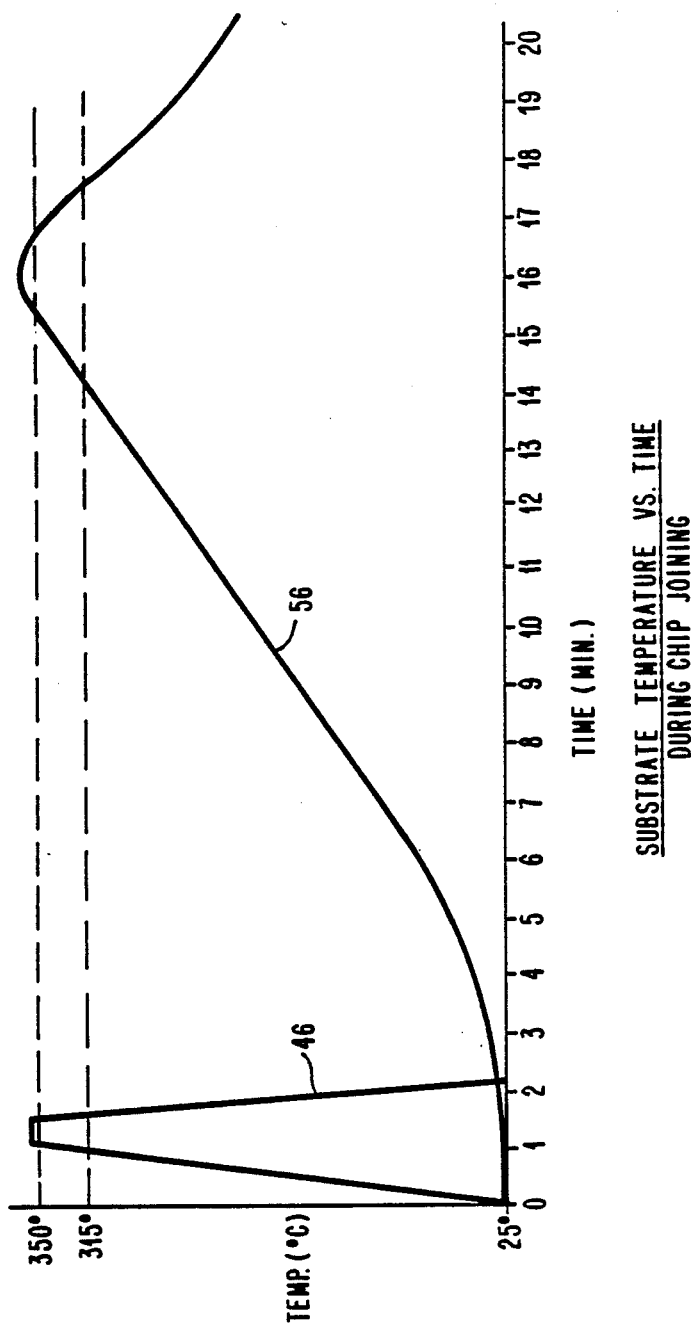

BONDING METHOD

This is a continuation of application Ser. No. 856,516 filed 4/28/86 now U.S. Pat. No. 4,747,533 issued 5/31/88.

BACKGROUND OF THE INVENTION

The present invention relates generally to solder reflow assembly techniques and apparatus therefor, more particularly to an apparatus and method for forming solder terminals between a substrate and a device, and rework processes.

A very common technique for joining an electronic element and a supporting substrate is forming solder connections between same. Patents which describes such solder connections and a method of forming these connections are U.S. Pat. Nos. 3,429,040 and 3,495,133. In general solder wettable pads are surrounded by non-solder wettable material, i.e., glass or quartz are provided on the device and also on the substrate. Solder is evaporated through a mask on either the device or substrate and heated to the melting point of the solder which causes it to ball up over the pads into mounds. After the solder balls have solidified, the device is positioned over the substrate with the respective solder pads in alignment, and the assembly heated to again melt or reflow the solder. When the solder balls are remelted and allowed to solidify solder connections are established between the solder wettable pads of the device and substrate. The surface tension of the molten solder will shift the device to correct for minor misalignments. If a device or a connection is defective, the device can be removed and replaced by remelting the solder connections, lifting off the device, and replacing it. When the substrate contains numerous devices, multiple device rework operations may be necessary before all the connections are perfect or to replace devices that fail in use.

It has been noted that repeated remelting of the solder, and exposure to high temperatures, particularly above 300° C. for extended time, as well as a slow rate of cooling from these temperatures causes the formation of intermetallics in solder connections which have a degrading influence. Intermetallics are compounds or alloys of the molecules of the solder and possibly the metals in the pad that have been placed in intimate contact during a process of brazing or soldering. In addition, exposure of the solder terminals to high temperatures causes grain growth within the terminals. Both intermetallics and grain growth degrade the solder connection by making it more brittle and less resistant to stress and strain. Strain is imposed on the solder connections by thermal cycling which normally occurs during use, particuirly when the coefficients of expansion of the materials of the device and substrate are different.

It is conventional to reflow the solder mounds to form a connection by placing the substrate with devices in place on a belt furnace and passing the assembly through the heated environment. The same basic process is used for other solder connections such as I/O pins to a substrate. This exposes the substrate, the device, and the solder bonds to a prolonged heating period, typically on the order of 20 minutes or longer. As the mass of the substrate increased, the non-uniformity of temperature in the substrate increased, the time at elevated temperature increased and the cooling rate decreased. Still further, as the substrate area increases, the number of devices on the substrate increase thereby increasing the probability of more rework operations, each of which requires a device separation and a solder reflow joining operation. Still further, the prolonged heating may damage the devices by degrading the metallurgy and spreading the diffused impurities thus moving the PN junctions and expanding the device impurity regions.

SUMMARY OF THE INVENTION

An object of this invention is to provide a new apparatus for reflowing solder connections which materially shortens thettime period that the device, the substrate, and the solder connections are exposed to elevated temperatures.

Another object is to provide more uniform heating of the substrate area.

Another object of this invention is to provide a new method for reflowing solder connections which materially shortens the time period that the device, the substrate, and the solder connections are exposed to elevated temperatures.

Yet another object of this invention is to provide an apparatus and a method that will perform solder reflow operations and eliminate or minimize device and solder bond degradation.

These and other objects of the invention are accomplished by an apparatus for reflowing solder terminals that join an electronic element to a support substrate which includes a stage for supporting the substrate, a quantity of fluid capable of being heated to a temperature in excess of the melting point of the solder of the solder terminals, a means to contact a surface of the substrate with the fluid, the means including at least one reservoir for maintaining fluid at a temperature in excess of the melting point of the solder, and a pumping means to move the fluid from reservoir into contact with a surface of the substrate.

Other objects, advantages and novel features of the present invention will become apparent from the following detailed description of the invention when considered in conjunction with the accompanying drawings.

BRIEF DESCRIPTION OF THE DRAWINGS

FIG. 5 is another heating profile of temperature versus time that provides a comparison of the heat cycle associated with this invention, and a typical heat cycle associated with a belt furnace performing a similar reflow operation.

DESCRIPTION OF THE PREFERRED EMBODIMENTS

Figure 1:
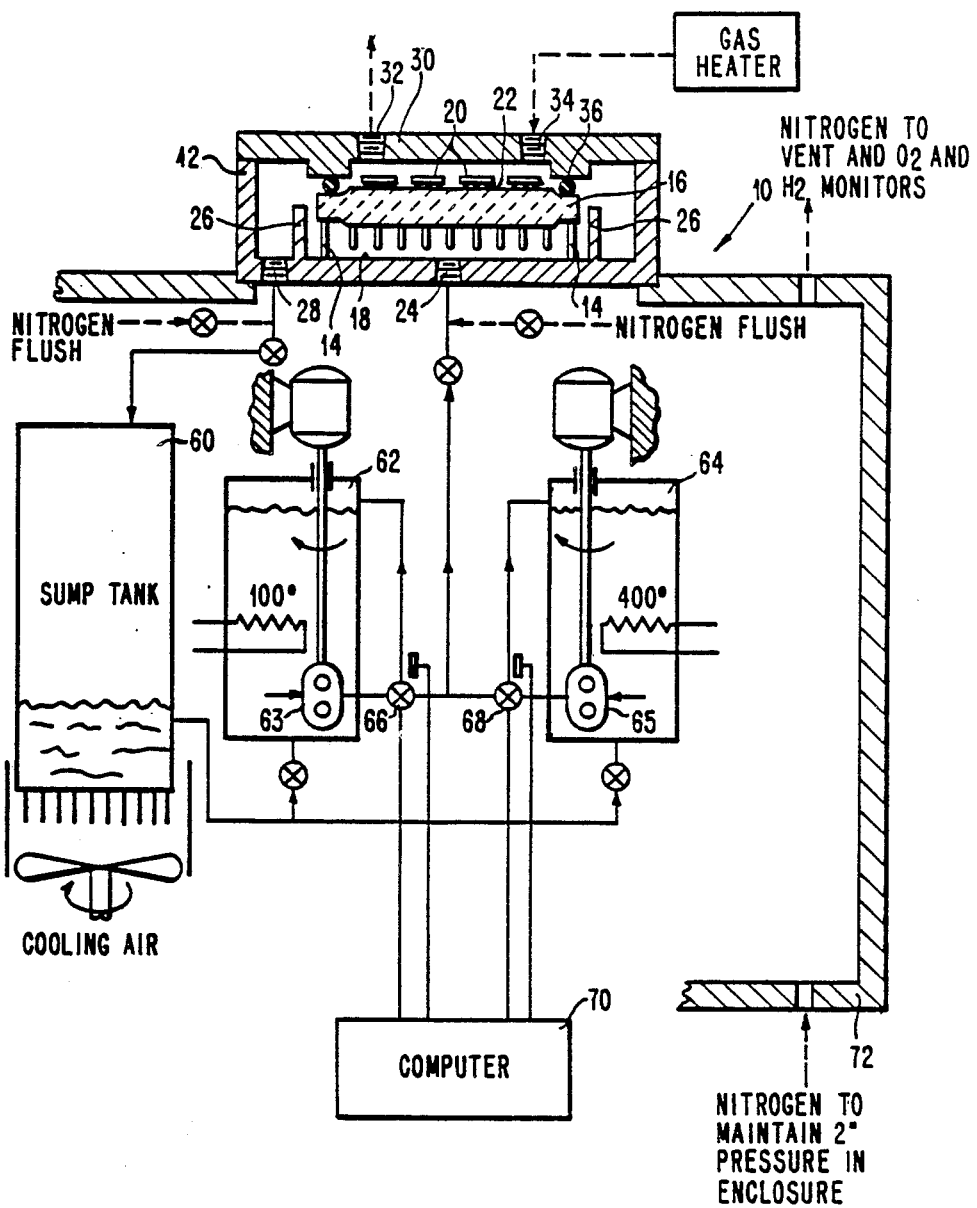
FIG. 1 is a front elevational view, in cross section, of the apparatus of the invention with various elements and their relationship illustrated schematically.
Figure 2:
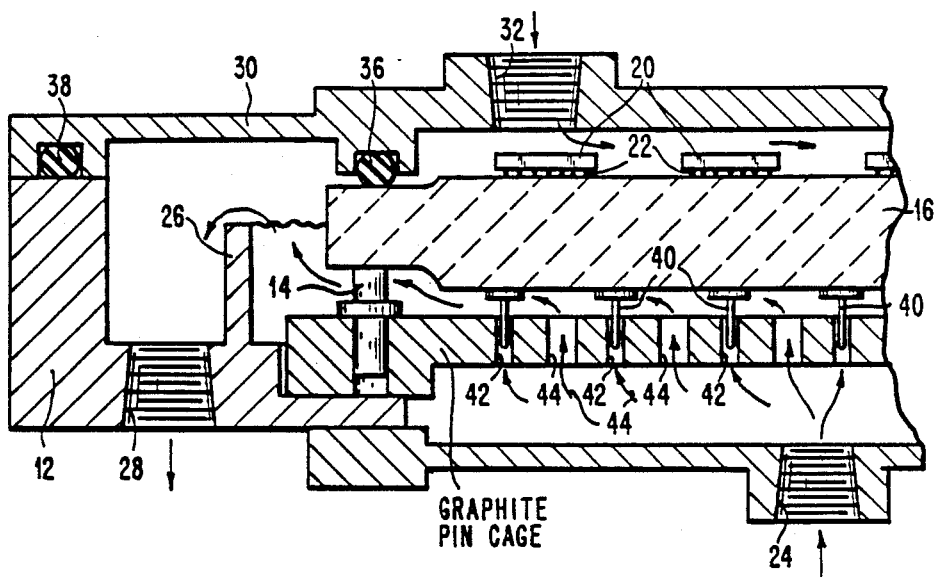
FIG. 2 is a front elevational view in an enlarged scale and broken section of the heating chamber of the apparatus of the invention.

Referring now to FIGS. 1 and 2 there is illustrated a preferred specific embodiment of the invention. The apparatus 10 for reflowing solder bonds, either to form the solder bonds or to melt bonds that have already been formed so that the substrate and device can be separated, has a container 12 having a stage 14 that supports substrate 16 above the floor 18 of container 12. The stage 14 can be pegs, fins, or any other suitable structure that engages the bottom surface of substrate 12 and maintains it at a predetermined height in the container. Devices 20 are shown positioned on and joined to substrate 16 with solder connections 22. In operation, fluid is pumped into container 12 through opening 24 to contact the bottom surface of substrate 16 to either heat or cool the substrate. The level of fluid is controlled by wier 26 as more clearly illustrated in FIG. 2. The fluid upon overflowing the wier exits the container through opening 28. A cover 30 can be provided for container 12 to provide an inert gas atmosphere which can also be heated, for heating the devices 20 on substrate 16. The cover 30 has openings 32 and 34 for introducing and removing inert or heated gas to container 12. Any desirable gas can be introduced and exhausted through openings 32 and 34, including forming gas, hydrogen gas or inert gases for flux free joining. The various gases can be either heated, cooled, or at room temperature. A seal 36 positioned between the cover 30 and the top surface of substrate 16 confines the chosen environment to the surface area of the substrate and also keeps fluid and fluid vapor from contacting the top surface. As shown in more detail in FIG. 2 another seal element 38 can be provided between the outer perimeter of cover 30 and container 12. The embodiment in FIG. 2 also includes an arrangement that provides support for pins 40 during the reflow heating cycle, when the pins are soldered or brazed on the substrate 16. In use the solder may soften during the heat cycle and stretch the solder securing them to the substrate. An apertured plate, preferably of graphite, is supported in container 12. Openings 42 have a diameter greater than the diameter of pins 40. As fluid is pumped into container 12 through opening 24 a portion of the fluid passes between the pins 40 and the walls of openings 42. The fluid applies hydraulic pressure against the pins and has a frictional drag on the pins surface which exerts upward forces that aid in supporting the pins. Additional openings 44 can be provided to permit a greater rate of fluid flow. The pattern of the openings can be varied to achieve uniform heating of the substrate e.g., if corners lag then fewer holes are provided at the center of the substrate and more at the corners.

Any suitable fluid can be used in the practice of my invention. Typically the fluid will be a liquid, such as oil or the like. The fluid must have a boiling point above the melting point of the solder material being reflowed and a relatively low vapor pressure as well as being non-explosive and non-toxic. The fluid should be sufficiently inert so that the surface of the substrate that it contacts is not degraded nor otherwise adversely affected. I have discovered that a suitable fluid is polyphenyl ether.

Figure 4:
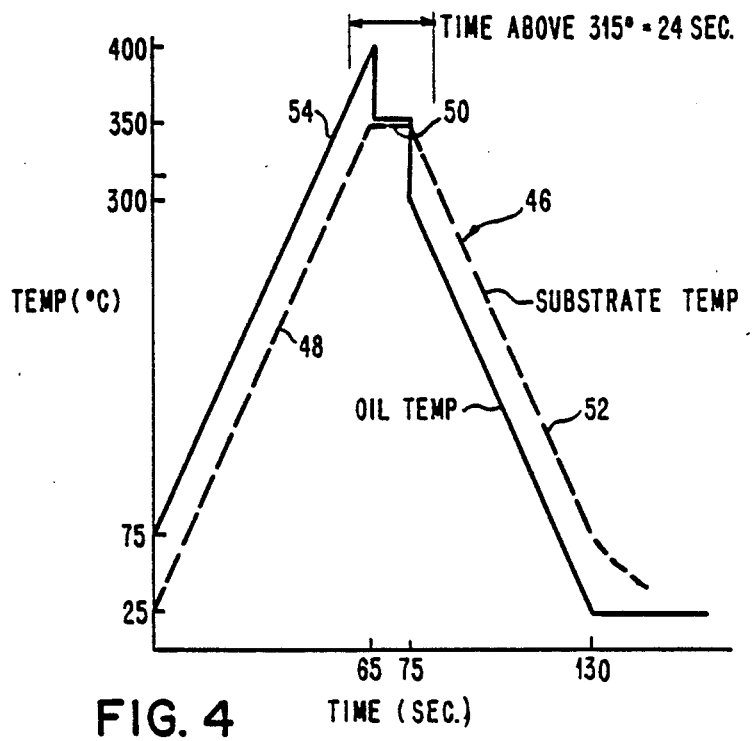
FIG. 4 is a heating profile of temperature versus time that depicts typical heating cycle used by the apparatus and process of the invention.

Referring now to FIG. 4 there is depicted by dashed lines a substrate temperature profile 46 consisting of a heat phase 48 where the substrate temperature increases at a rapid rate, a hold phase 50 where the substrate temperature is constant for a short time, and finally a cooling phase 52 where the substrate temperature is decreased rapidly. In order to achieve this substrate temperature profile, the fluid temperature profile 54 is maintained in container 12 by a mechanism to be described. Since there is a time lag between the substrate temperature and the fluid temperature. The profile 54 depicting fluid temperature therefore is several degrees higher than the substrate temperature as depicted by profile 46. Heating or cooling the substrate with liquid is much faster and more efficient than cooling with air or gas as a heating medium, or radiant heat. FIG. 5 provides a vivid comparison between a substrate profile 46 using a liquid as a heating and cooling medium, and profile 56 using heated air or inert gas in a belt furnace, for similar ceramic substrates. Experimental measurements on 90 mm square substrates have shown heat transfer efficiency in oil heating to be 40 times that in the hottest zone of a belt furnace.

Referring now to FIG. 1 of the drawings sump tank 60 is shown receiving the fluid from container 12 that has overflowed wier 26 after coming in contact with substrate 16. The fluid is cooled and subsequently returned to holding tanks 62 and 64 where the temperature of the fluid is maintained, or the fluid heated. The fluid is stored at either a relatively low temperature for cooling purposes or a high temperature for heating purposes. Pumps 63 and 65 are provided in tanks 62 and 64, respectively, to supply the fluids, properly blended, to achieve the proeer temperature to container 12. Valves 66 and 68 that control the flow of fluid from pumps 63 and 65 shift the flow from circulation within the tank to ensure uniformity of temperature throughout the tank to delivery to the processing containers. The computer controls the speed of the two pumps. Computer 70 is programmed to provide the proper blend of hot and cool liquids at the proper time to achieve an oil temperature profile, such as depicted in FIG. 4. Preferably the plumbing and the tanks are enclosed in a chamber 72 and a nitrogen environment maintained therein for safety.

Figure 3:
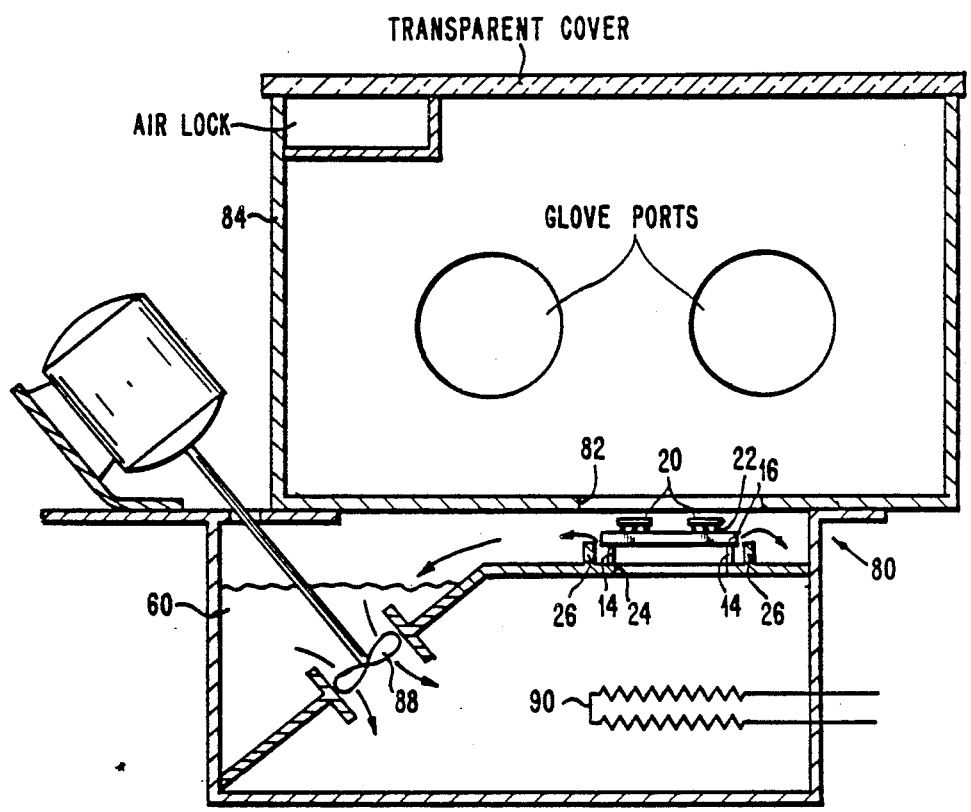
FIG. 3 is a front elevational view, in cross section, illustrating another embodiment of the apparatus of the invention.

In FIG. 3 there is depicted another preferred specific embodiment of the apparatus 80 of my invention. Apparatus 80 does not have the capability of providing a closely controlled heating profile possible with apparatus 10. However the apparatus is useful for removing devices 20 from substrates 16 for rework or for joining devices by manually placing and removing substrates on stage 14. The substrate 16 is accessible through opening 82 in glove box 84. Normally an inert gas environment is provided in glove box 84. Fluid is forced from the sump 60 into chamber 86 by pump 88. The fluid is forced upwardly through opening 24 into contact with the substrates 16. The fluid after overflowing wier 26 flows back to sump 60 and the process is repeated. A heating element 90 provides control of the fluid temperature.

FIG. 5 of the drawing illustrates a heating profile 46 of the temperature on the top of ceramic substrate vs. time obtained by using the apparatus and process of this invention using a heated liquid, and subsequently a cooling liquid applied to the bottom surface of the substrate. By way of comparison profile 56 vs. a plate of temperature on the top of the same ceramic substrate vs. time obtained with a belt furnace. These profiles dramatically illustrate the differences that the time a substrate is exposed to elevated temperatures.

The apparatus and method of the invention is particularly suited for solder bonding integrated circuit semiconductor devices to a ceramic substrate. However, the invention can be used for any application where it is advantageous to solder, braze, or otherwise bond elements to a workpiece without exposing the elements and/or the bond to elevated temperatures for lengthy periods of time or otherwise control the temperature for any reason. In particular, the invention is useful for bonding I/O pins, capacitors, attachment chips and the like to substrates of any material, and to remove and rebond elements where the assembly must be re-worked to correct for defects and the like. In the preferred embodiment, the environment on a surface of the substrate can be controlled to protect the elements to be bonded, or achieve conditions that are conducive to bonding integrity.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

I claim:

1. A method of reflowing solder terminals that join an electronic device to a substrate, comprising,
    contacting the bottom surface of said substrate with a liquid,
    rapidly increasing the temperature of said liquid from a temperature below the melting point of the solder to a temperature exceeding the melting point of the solder material of said solder terminals,
    subsequently rapidly decreasing the temperature of said liquid to a temperature below the melting point of the solder material of said solder terminals.

2. The method of claim 1 wherein said electronic device is an integrated semiconductor device provided with a plurality of solder pads distributed over the bottom side, and said substrate is a multilayer ceramic substrate with a corresponding plurality of solder pads on the top surface.

3. The method of claim 2 wherein said fluid is polyphenyl ether.

4. The method of claim 3 wherein the top surface only of said substrate is maintained in a controlled environment.

5. The method of claim 2 wherein the entire heating and cooling cycle is less than five minutes in duration.

6. The method of claim 4 wherein said controlled environment is an inert gas.

7. The method of claim 4 wherein said controlled environment includes forming gas.

8. The method of claim 4 wherein said controlled environment is a heated gas.

9. The method of claim 1 wherein said substrate, when contacted with said liquid for the steps of rapidly increasing the temperature and rapidly decreasing the temperature of said liquid, remains stationary and in the same position for both of said steps.

10. A method of reflowing solder terminals that join an electronic device to a substrate, comprising,
    contacting the bottom surface of said substrate with a liquid, and
    controlling the temperature of said liquid when in contact with said substrate so that the temperature of said liquid in contact with said substrate is varied, comprising:
        rapidly increasing the temperature of said liquid from a temperature below the melting point of the solder to a temperature exceeding the melting point of the solder of said solder terminals, and
        subsequently rapidly decreasing the temperature of said liquid to a temperature below the melting point of the solder of said solder terminals.

11. The process of claim 10 wherein the solder material of said terminals is reflowed to establish electrical connections.

12. The method of claim 10 wherein said substrate, when contacted with said liquid for the steps of rapidly increasing the temperature and rapidly decreasing the temperature of said liquid, remains stationary and in the same position for both of said steps.

13. A method of reflowing solder terminals that join an electronic device to a substrate, comprising,
    contacting the bottom surface of said substrate with a liquid, and
    controlling the temperature of said liquid when in contact with said substrate so that the temperature of said liquid in contact with said substrate is varied, comprising:
        rapidly increasing the temperature of said liquid from a temperature below the melting point of the solder to a temperature exceeding the melting point of the solder of said solder terminals, and
        subsequently rapidly decreasing the temperature of said liquid to a temperature below the melting point of the solder of said solder terminals,
    wherein said method is a re-work process wherein the device is separated from the substrate when the solder material becomes molten.

* * * * *